US012588441B2

(12) United States Patent
Chen et al.

(10) Patent No.: US 12,588,441 B2
(45) Date of Patent: Mar. 24, 2026

(54) SEMICONDUCTOR DEVICE INCLUDING DUAL DAMASCENE STRUCTURE AND METHOD FOR FABRICATING THE SAME

(71) Applicant: Taiwan Semiconductor Manufacturing Company, Ltd., Hsinchu (TW)

(72) Inventors: Chien-Han Chen, Nantou County (TW); Hung-Chun Chen, Taipei (TW); Yuan-Chun Chien, Taipei (TW); Wei Tse Hsu, Hsinchu County (TW); Yu-Yu Chen, Hsinchu (TW); Chien-Chih Chiu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 610 days.

(21) Appl. No.: 17/841,679

(22) Filed: Jun. 16, 2022

(65) Prior Publication Data

US 2023/0411144 A1      Dec. 21, 2023

(51) Int. Cl.
*H01L 21/02*      (2006.01)
*H01L 21/3105*      (2006.01)
*H01L 21/768*      (2006.01)
(52) U.S. Cl.
CPC .. *H01L 21/02178* (2013.01); *H01L 21/02425* (2013.01); *H01L 21/31053* (2013.01); *H01L 21/76829* (2013.01)
(58) Field of Classification Search
CPC ......... H01L 21/02178; H01L 21/02425; H01L 21/31053; H01L 21/76829; H01L 21/0334; H01L 21/0337; H01L 21/31144; H01L 21/76811; H01L 21/76813
See application file for complete search history.

(56) References Cited

U.S. PATENT DOCUMENTS

| | | | |
|---|---|---|---|
| 2017/0018458 A1* | 1/2017 | Cheng | ............... H01L 21/02063 |
| 2018/0197771 A1* | 7/2018 | Chang | ............... H01L 21/76877 |
| 2018/0337047 A1* | 11/2018 | Fung | .................. H01L 21/0337 |

OTHER PUBLICATIONS

Tong, M., et al. "A comparative study of wet and dry selective etching processes for GaAs/AlGaAs/InGaAs pseudomorphic MODFETs." Journal of Electronic Materials 21 (1992): 9-15. (Year: 1992).*
Arango-Ospina, Marcela, et al. "Silicon oxycarbide based materials for biomedical applications." Applied Materials Today 18 (2020): 100482. (Year: 2020).*

* cited by examiner

*Primary Examiner* — Norman D Richards
*Assistant Examiner* — Ethan Edward Cutler
(74) *Attorney, Agent, or Firm* — JCIPRNET

(57) ABSTRACT

A method for forming a semiconductor device includes followings. A metal layer is formed to embedded in a first dielectric layer. An etch stop layer is formed over the metal layer and the first dielectric layer. A second dielectric layer is formed over the etch stop layer. A portion of the second dielectric layer is removed to expose a portion of the etch stop layer and to form a via by a dry etching process. The portion of the etch stop layer exposed by the second dielectric layer is removed to expose the metal layer and to form a damascene cavity by a wet etching process. A damascene structure is formed in the damascene cavity.

20 Claims, 11 Drawing Sheets

SEMICONDUCTOR DEVICE INCLUDING DUAL DAMASCENE STRUCTURE AND METHOD FOR FABRICATING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging. In the fabrication of semiconductor devices, the size of semiconductor devices has been continuously reduced in order to increase device density. Accordingly, a multi-layered interconnect structure is provided. The interconnect structure may include one or more conductive lines and via layers. Although existing interconnect structures and methods of fabricating interconnect structures have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
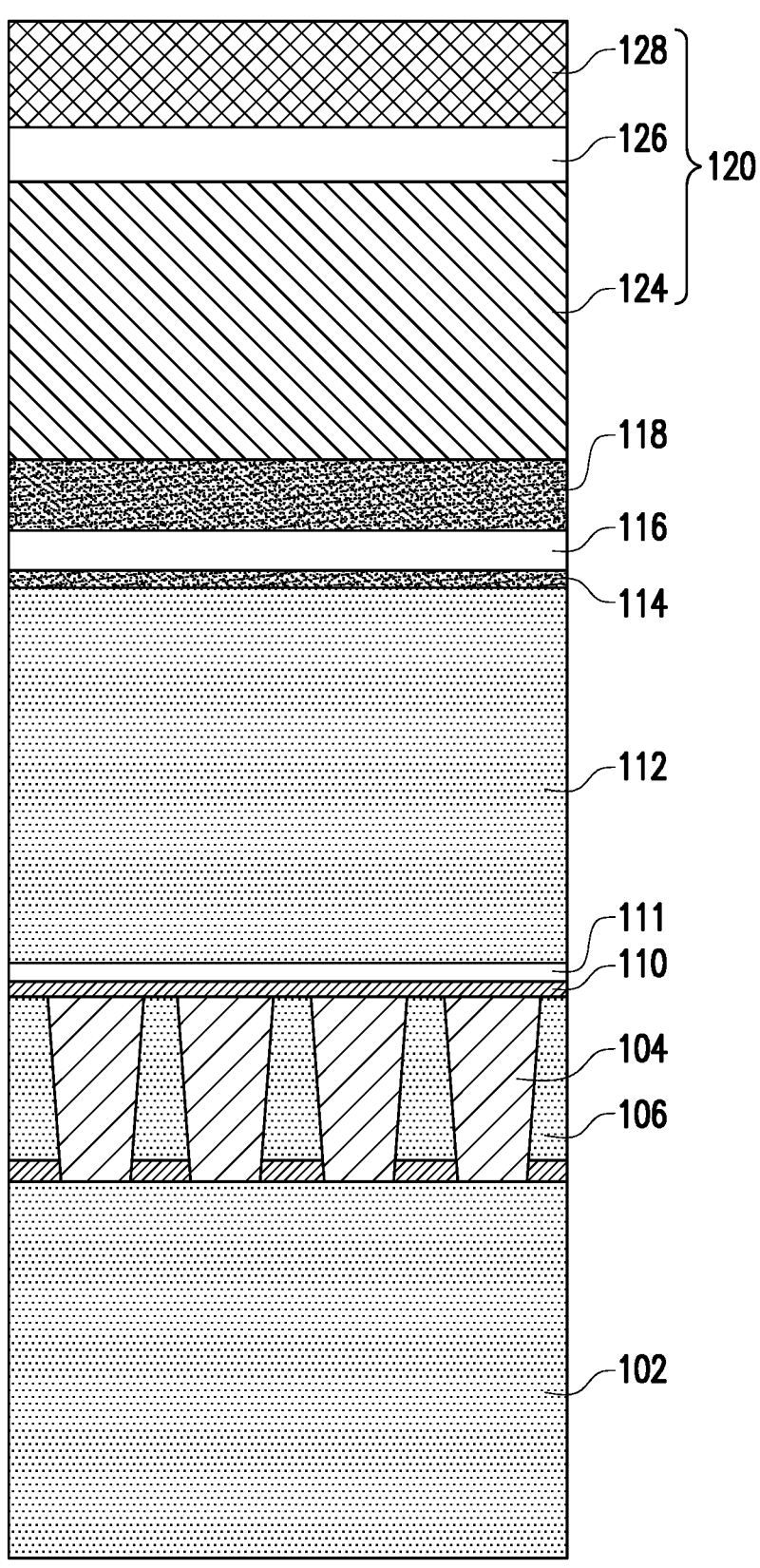
FIG. 1 through FIG. 10 are cross-sectional views schematically illustrating a process flow for fabricating a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments for forming a semiconductor structure with an interconnect structure are provided. The interconnect structure includes a number of metallization layers formed in a dielectric layer (such as inter-metal dielectric, IMD). A process for forming interconnect structures is the dual damascene process.

FIG. 1 through FIG. 10 schematically illustrate cross-sectional views of various stages of forming a semiconductor device with an interconnect structure, in accordance with some embodiments of the disclosure. FIG. 1 through FIG. 10 schematically illustrate a fabricating process of a dual damascene structure in accordance with some embodiments of the disclosure.

Referring to FIG. 1, a semiconductor device 100 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Some device elements (not shown) are formed in the substrate 102. Device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes. In some embodiments, device elements are formed in the substrate 102 through a front-end-of-line (FEOL) process.

The substrate 102 may include various doped regions such as p-type wells or n-type wells). Doped regions may be doped with p-type dopants, such as boron or BF2, and/or n-type dopants, such as phosphorus (P) or arsenic (As). The doped regions may be formed directly on the substrate 102, in a P-well structure, in an N-well structure, or in a dual-well structure.

The substrate 102 may further include isolation features (not shown), such as shallow trench isolation (STI) features or local oxidation of silicon (LOCOS) features. Isolation features may define and isolate various device elements.

As shown in FIG. 1, a first dielectric layer 106 (such as inter-metal dielectric, IMD) is formed on the substrate 102, and a first metal layer 104 is embedded in first dielectric layer 106. The first dielectric layer 106 and first metal layer 104 are formed through a back-end-of-line (BEOL) process.

The first dielectric layer 106 may be a single layer or multiple layers. The first dielectric layer 106 is made of silicon oxide (SiOx), silicon nitride (SixNy), silicon oxynitride (SiON), dielectric material(s) with low dielectric constant (low-k), or combinations thereof. In some embodiments, the first dielectric layer 106 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyaryplether (PAE), porous SiLK, or porous silicon oxide (SiO2). In some embodiments, the dielectric layer 106 is deposited by a plasma enhanced chemical vapor deposition (PECVD) process or by a spin coating process.

In some embodiments, the first metal layer 104 is made of copper (Cu), copper alloy, aluminum (Al), aluminum alloy, tungsten (W), tungsten alloy, titanium (Ti), titanium alloy, tantalum (Ta) or tantalum alloy. In some embodiments, the first metal layer 104 is formed by a plating method.

An etch stop layer 110 is formed over the first dielectric layer 106. The etch stop layer 110 may be or include a single layer or multiple layers. The etch stop layer 110 protects the underlying layers, such as the first dielectric layer 106. The etch stop layer 110 provides improved adhesion for layers formed subsequently. The etch stop layer 110 is made of a metal-containing material, such as aluminum-containing material. In some embodiments, the aluminum-containing material is aluminum nitride, aluminum oxide or aluminum oxynitride.

Afterwards, an adhesion layer 111 is formed over the etch stop layer 110. The adhesion layer 111 is configured to adhere the etching stop layer 110 to another dielectric layer thereon. The adhesion layer 111 is made of dielectric layer, such as silicon oxide formed by tetraethoxysilane (TEOS), or oxygen doped silicon carbide (SiC:O, ODC).

A second dielectric layer 112 is formed over the adhesion layer 111 and the etch stop layer 110. The adhesion layer 111 is formed between the second dielectric layer 112 and the etch stop layer. The second dielectric layer 112 is in contact with the adhesion layer 111. The second dielectric layer 112 may be a single layer or multiple layers. The second dielectric layer 112 is made of silicon oxide (SiOx), silicon nitride (SixNy), silicon oxynitride (SiON), dielectric material(s) with low dielectric constant (low-k), or combinations thereof. In some embodiments, the second dielectric layer 112 is made of an extreme low-k (ELK) dielectric material with a dielectric constant (k) less than about 2.5.

A first dielectric layer 114, a hard mask layer 116 and a second dielectric layer 118 are sequentially formed over the second dielectric layer 112. In some embodiments, the first and second dielectric layers 114 and 118 are made of nitrogen-free material, such as silicon oxycarbide (SiOC). In some embodiments, the hard mask layer 116 is sandwiched between the first dielectric layer 114 and the second dielectric layer 118 and is made of a metal material, such as tungsten carbide (WC). The hard mask layer 116 made of metal material is configured to provide a high etch selectivity relative to the second dielectric layer 112 during the plasma process.

A tri-layer photoresist structure 120 is formed on the second dielectric layer 118. The tri-layer photoresist structure 120 includes a bottom layer 124, a middle layer 126 and a top layer 128. In some embodiments, the bottom layer 124 is a bottom anti-reflection coating (BARC) layer which is used to reduce reflection during the photolithography process. In some embodiments, the bottom layer 124 is made of nitrogen-free material, such as silicon rich oxide, or silicon oxycarbide (SiOC). In some embodiments, the middle layer 126 is made of silicon-based material, such as silicon nitride, silicon oxynitride or silicon oxide. The top layer 128 may be a positive photoresist layer or a negative photoresist layer. In some embodiments, the top layer 128 is made of Poly (methyl methacrylate) (PMMA), Poly (methyl glutarimide) (PMGI), Phenol formaldehyde resin (DNQ/Novolac) or SU-8 or other suitable polymers. In some embodiments, the ratio of the thickness of the bottom layer 124 to the thickness of the middle layer 126 is in a range from about 4 to about 8.

Figure 2:
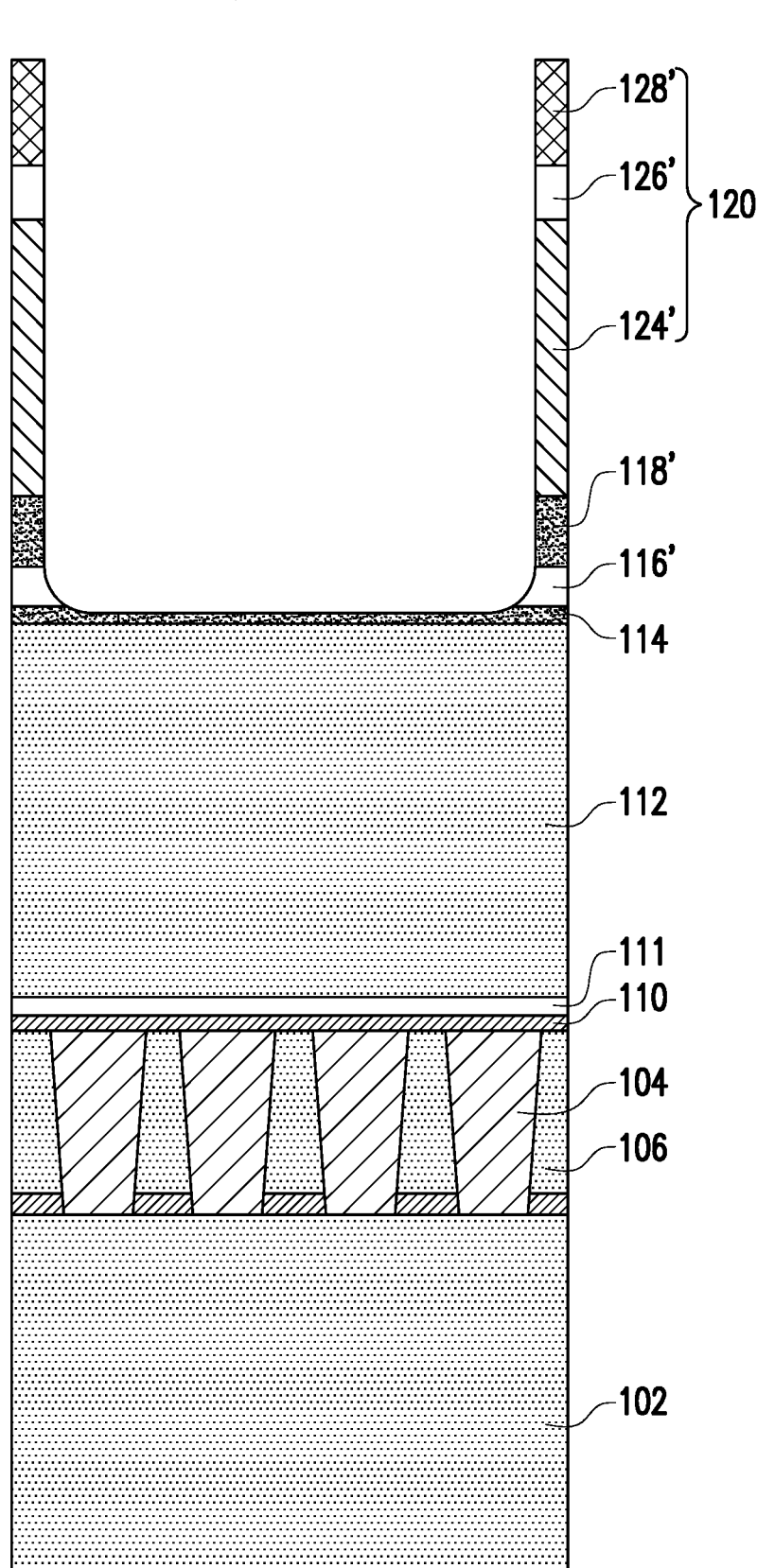

Referring to FIG. 1 and FIG. 2, the top layer 128 is patterned through a photolithography process to form a patterned top layer 128' in accordance with some embodiments of the disclosure. The patterned top layer 128' includes a trench for revealing a top surface of the middle layer 126. After the top layer 128 is patterned, the middle layer 126 is revealed and patterned by using the patterned top layer 128' as a mask in accordance with some embodiments of the disclosure. The pattern of the patterned top layer 128' is transferred to the middle layer 126 to form a patterned middle layer 126'. After the middle layer 126 is patterned, the bottom layer 124 is revealed and patterned by using the patterned middle layer 126' as a mask in accordance with some embodiments of the disclosure. The pattern of the patterned middle layer 126' is transferred to the bottom layer 124 to form a patterned bottom layer 124'. After the bottom layer 124 is patterned, the second dielectric layer 118 is revealed and patterned by using the patterned bottom layer 124' as a mask in accordance with some embodiments of the disclosure. The pattern of the patterned bottom layer 124' is transferred to the second dielectric layer 118 to form a patterned second dielectric layer 118'. Afterwards, the hard mask layer 116 is patterned by using a patterned tri-layer photoresist structure 120' and the patterned second dielectric layer 118' as masks such that a patterned hard mask layer 116' is formed. During the patterning process of the hard mask layer 116, the first dielectric layer 114 may be partially removed to ensure that the trench defined by the patterned top layer 128' can be successfully transferred to the patterned hard mask layer 116'.

As illustrated in FIG. 2, the patterned tri-layer photoresist structure 120' includes the patterned bottom layer 124' overlying the patterned second dielectric layer 118', the patterned middle layer 126' disposed on the patterned bottom layer 124' as well as the patterned top layer 128' disposed on the patterned middle layer 126'. The patterning process of the hard mask layer 116, the second dielectric layer 118, the bottom layer 124 and the middle layer 126 may be or include at least one etching process.

Figure 3:
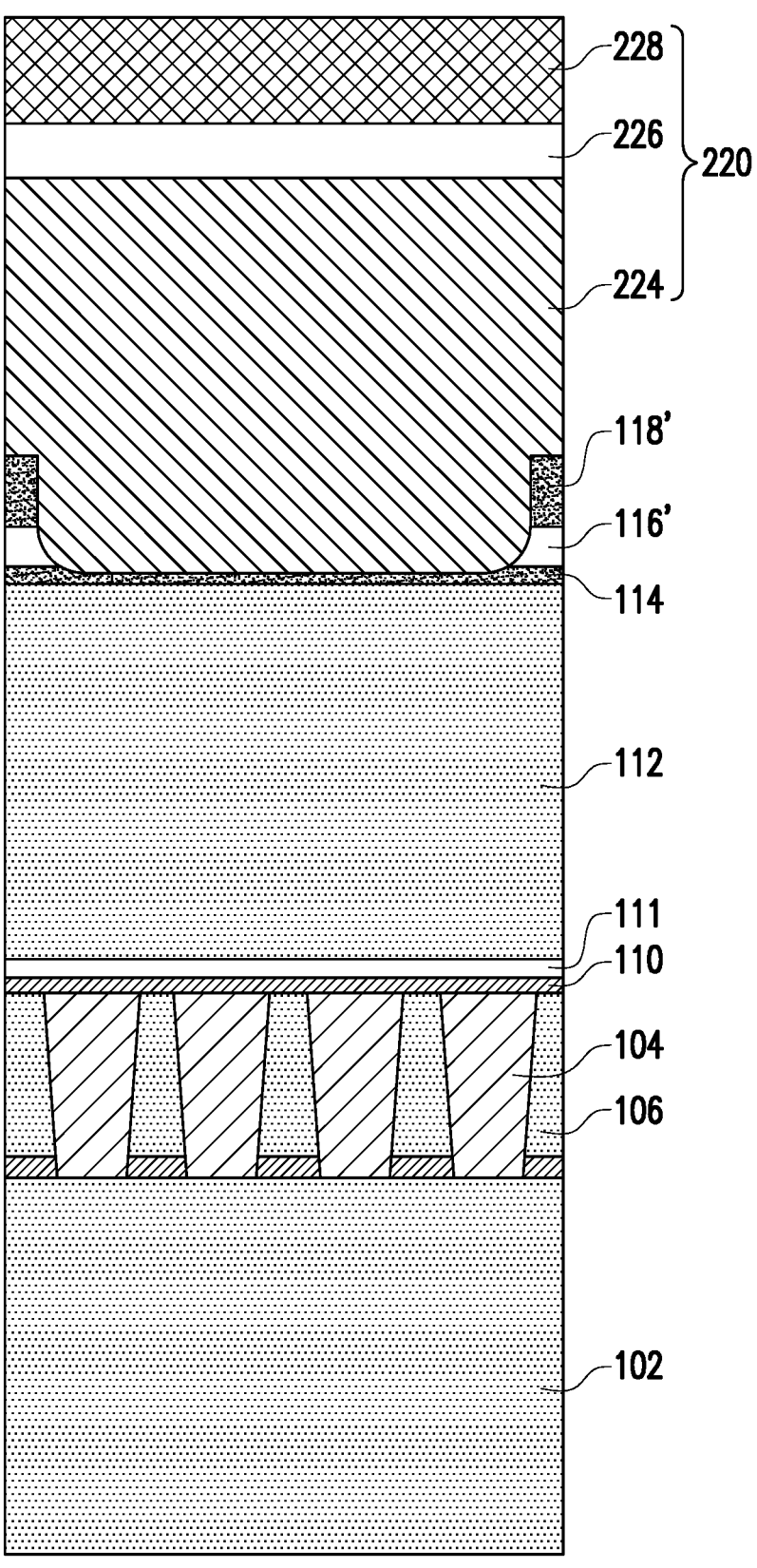

Referring to FIG. 2 and FIG. 3, the patterned tri-layer photoresist structure 120' is removed from the patterned second dielectric layer 118' by an etching process. Therefore, the patterned hard mask layer 116' covered by the patterned second dielectric layer 118' is obtained, wherein the patterned hard mask layer 116' and the patterned second dielectric layer 118' include a trench formed therein.

After the patterned hard mask layer 116' is formed, a tri-layer photoresist structure 220 is formed to cover the first dielectric layer 114, the patterned hard mask layer 116' and the second dielectric layer 118'. The tri-layer photoresist structure 220 includes a bottom layer 224, a middle layer 226 and a top layer 228. In some embodiments, the bottom layer 224 is a bottom anti-reflection coating (BARC) layer which is used to reduce reflection during the photolithography process. In some embodiments, the bottom layer 224 is made of nitrogen-free material, such as silicon rich oxide, or silicon oxycarbide (SiOC). In some embodiments, the middle layer 226 is made of silicon-based material, such as silicon nitride, silicon oxynitride or silicon oxide. The top layer 228 may be a positive photoresist layer or a negative photoresist layer. In some embodiments, the top layer 228 is made of Poly (methyl methacrylate) (PMMA), Poly (methyl glutarimide) (PMGI), Phenol formaldehyde resin (DNQ/Novolac) or SU-8. In some embodiments, the ratio of the thickness of the bottom layer 224 to the thickness of the middle layer 226 is in a range from about 4 to about 8.

Figure 4:
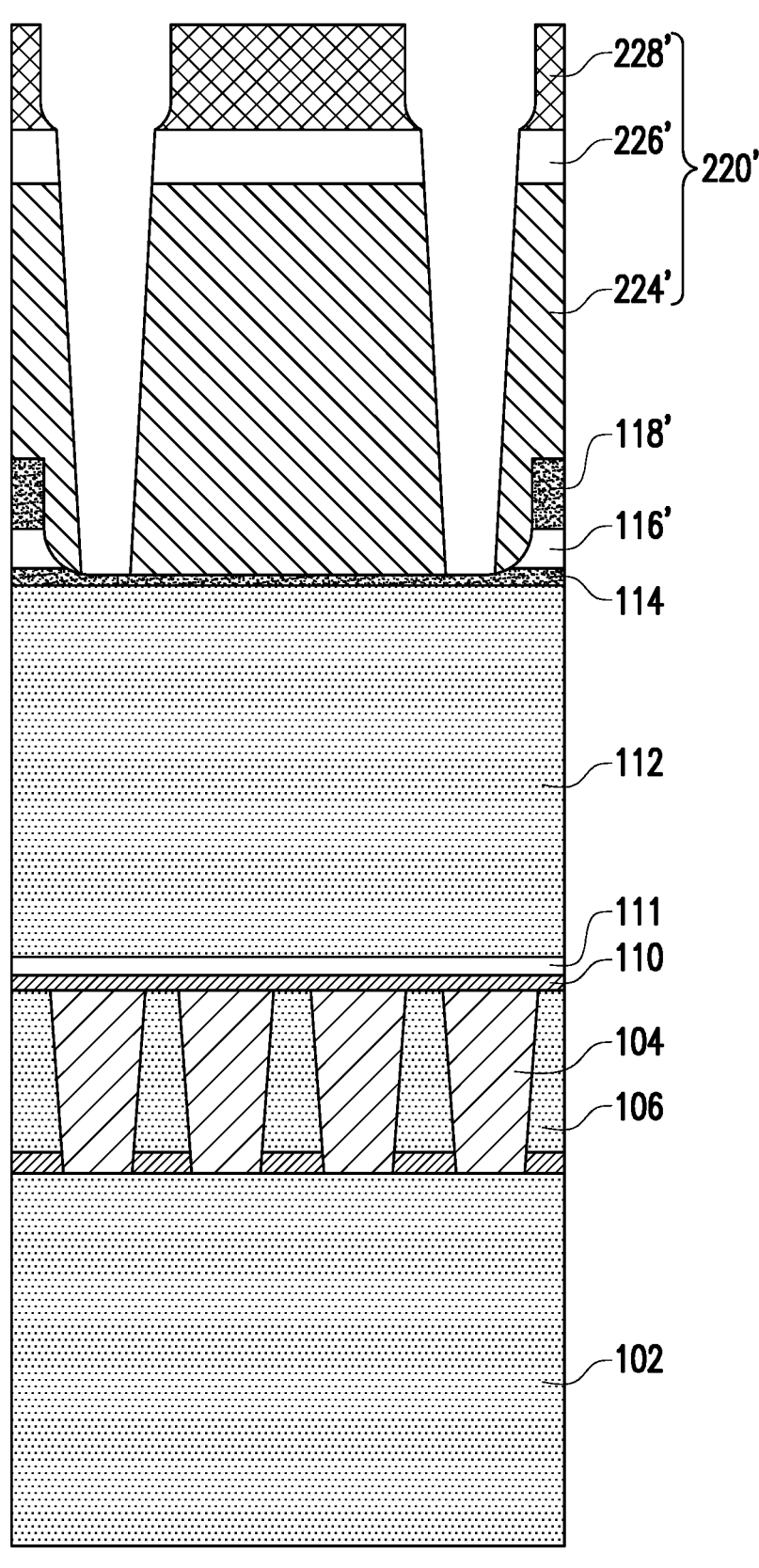

Referring to FIG. 3 and FIG. 4, the top layer 228 is patterned through a photolithography process to form a patterned top layer 228' in accordance with some embodiments of the disclosure. The patterned top layer 228' includes multiple via openings for revealing a top surface of the middle layer 226. After the top layer 228 is patterned, the middle layer 226 is revealed and patterned by using the patterned top layer 228' as a mask in accordance with some embodiments of the disclosure. The pattern of the patterned top layer 228' is transferred to the middle layer 226 to form a patterned middle layer 226'. After the middle layer 226 is patterned, the bottom layer 224 is revealed and patterned by using the patterned middle layer 226' as a mask in accordance with some embodiments of the disclosure. The pattern of the patterned middle layer 226' is transferred to the bottom layer 224 to form a patterned bottom layer 224'. After the bottom layer 224 is patterned, portions of the first dielectric layer 114 uncovered by the patterned hard mask layer 116' and the patterned second dielectric layer 118' are revealed. The patterning process for forming the patterned tri-layer photoresist structure 220' may be or include a dry etching process.

The above-mentioned dry etching process for forming the patterned tri-layer photoresist structure 220' may be or include a plasma treatment using an etch gas including oxygen gas ($O_2$), carbon dioxide ($CO_2$) or another applicable gas. In addition to gas, the dry etching process may be fine-tuned with various parameters, such as pressure, power, temperature and/or other suitable parameters.

As illustrated in FIG. 4, the patterned tri-layer photoresist structure 220' includes the patterned bottom layer 224' overlying the patterned second dielectric layer 118', the patterned middle layer 226' disposed on the patterned bottom layer 224' as well as the patterned top layer 228' disposed on the patterned middle layer 226'.

Figure 5:
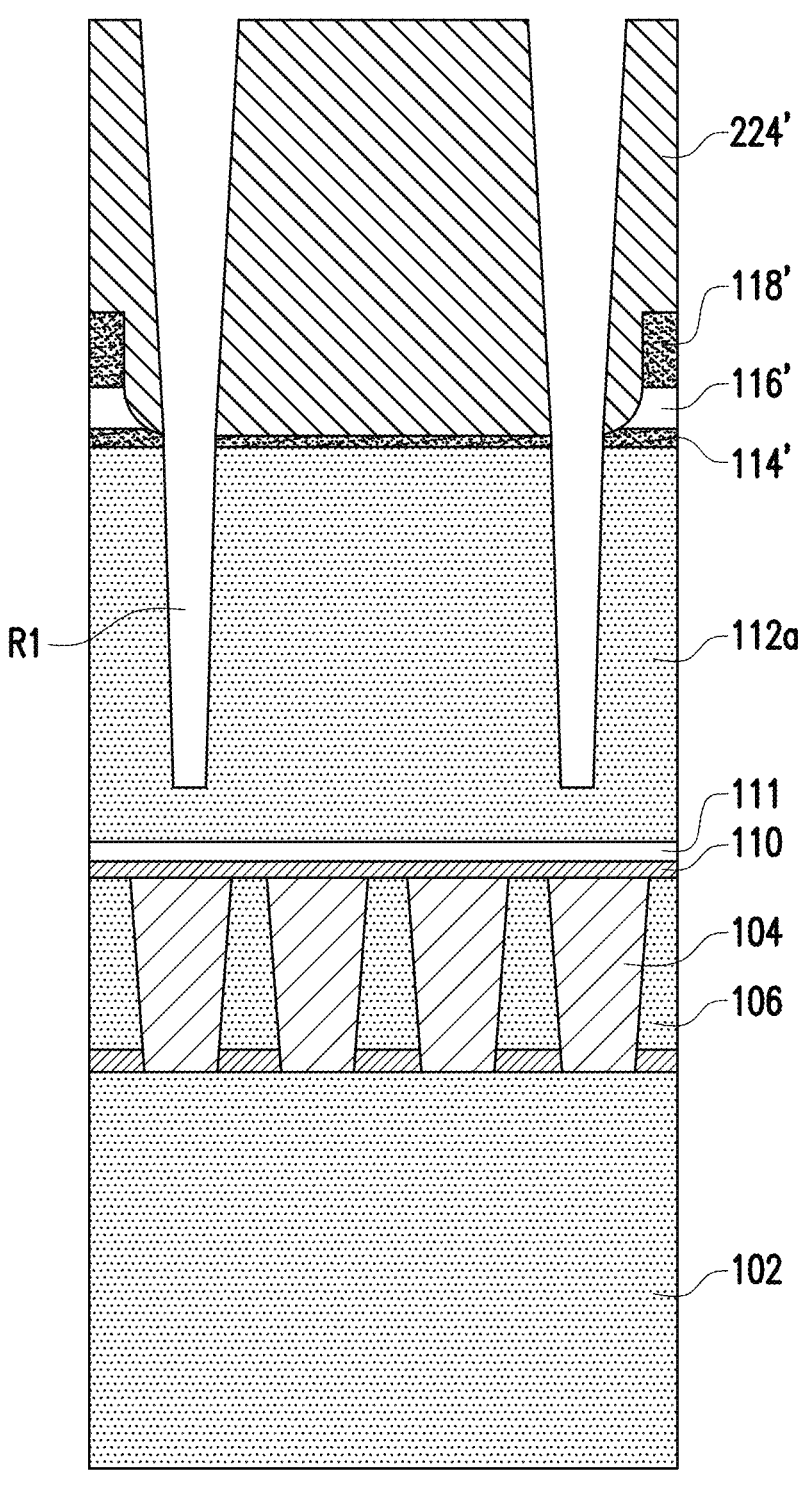

Referring to FIG. 4 and FIG. 5, after forming the patterned tri-layer photoresist structure 220', portions of the first dielectric layer 114 uncovered by the patterned tri-layer photoresist structure 220' are removed by a dry etching process such that a patterned first dielectric layer 114' and a patterned second dielectric layer 112a having recesses R1 distributed therein are formed. During the forming process of the recesses R1, the patterned top layer 228' and the patterned middle layer 226' are removed by the above-mentioned dry etching process. As illustrated in FIG. 5, the top surface of the patterned bottom layer 224' is revealed after forming the patterned second dielectric layer 112a having recesses R1 distributed therein.

The above-mentioned dry etching process for forming the recesses R1 may be or include a plasma treatment using an etch gas including oxygen gas ($O_2$), carbon dioxide ($CO_2$) or another applicable gas. In addition to gas, the dry etching process may be fine-tuned with various parameters, such as pressure, power, temperature and/or other suitable parameters.

Figure 6:
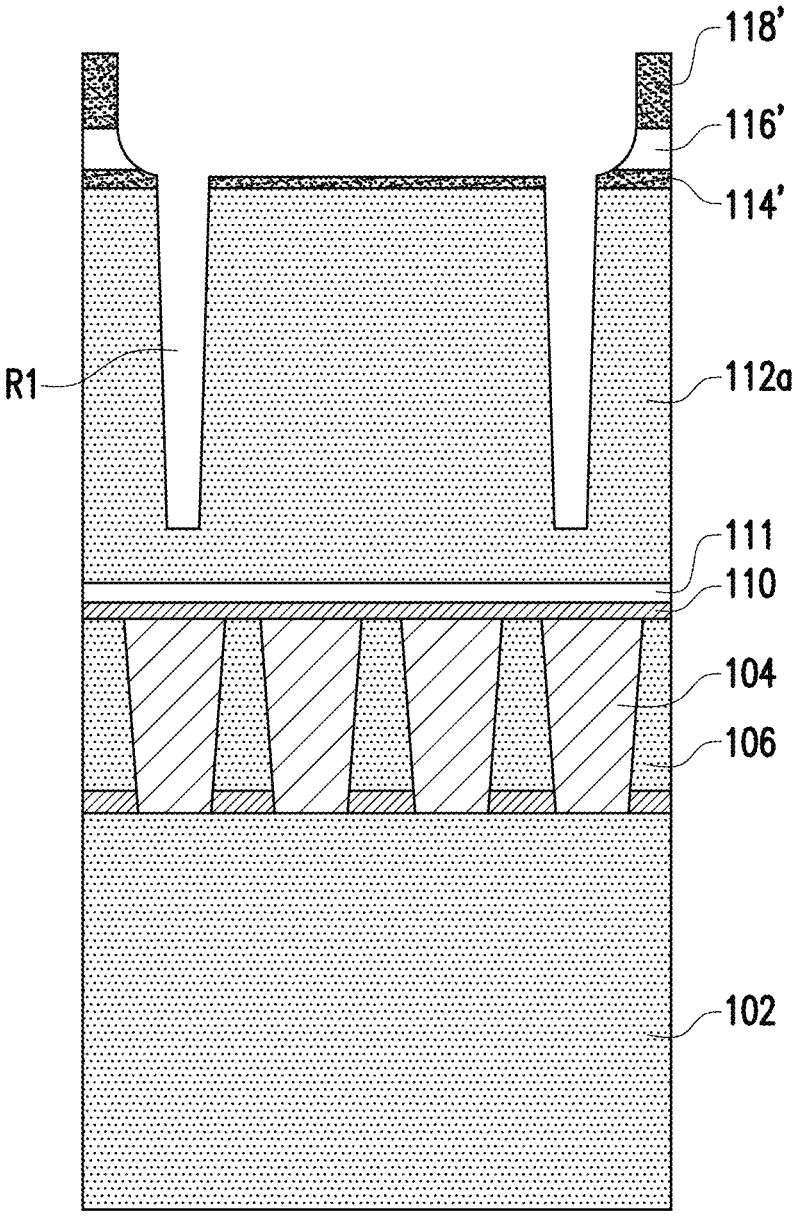

Referring to FIG. 5 and FIG. 6, an ash process is performed to remove the remaining patterned bottom layer 224' until the patterned first dielectric layer 114', the patterned hard mask layer 116' and the patterned second dielectric layer 118' are revealed. The ash process for removing the remaining patterned bottom layer 224' may be or include a dry etching process.

The above-mentioned dry etching process for removing the remaining patterned bottom layer 224' may be or include a plasma treatment using an etch gas including oxygen gas ($O_2$), carbon dioxide ($CO_2$) or another applicable gas. In addition to gas, the dry etching process may be fine-tuned with various parameters, such as pressure, power, temperature and/or other suitable parameters.

Figure 7:
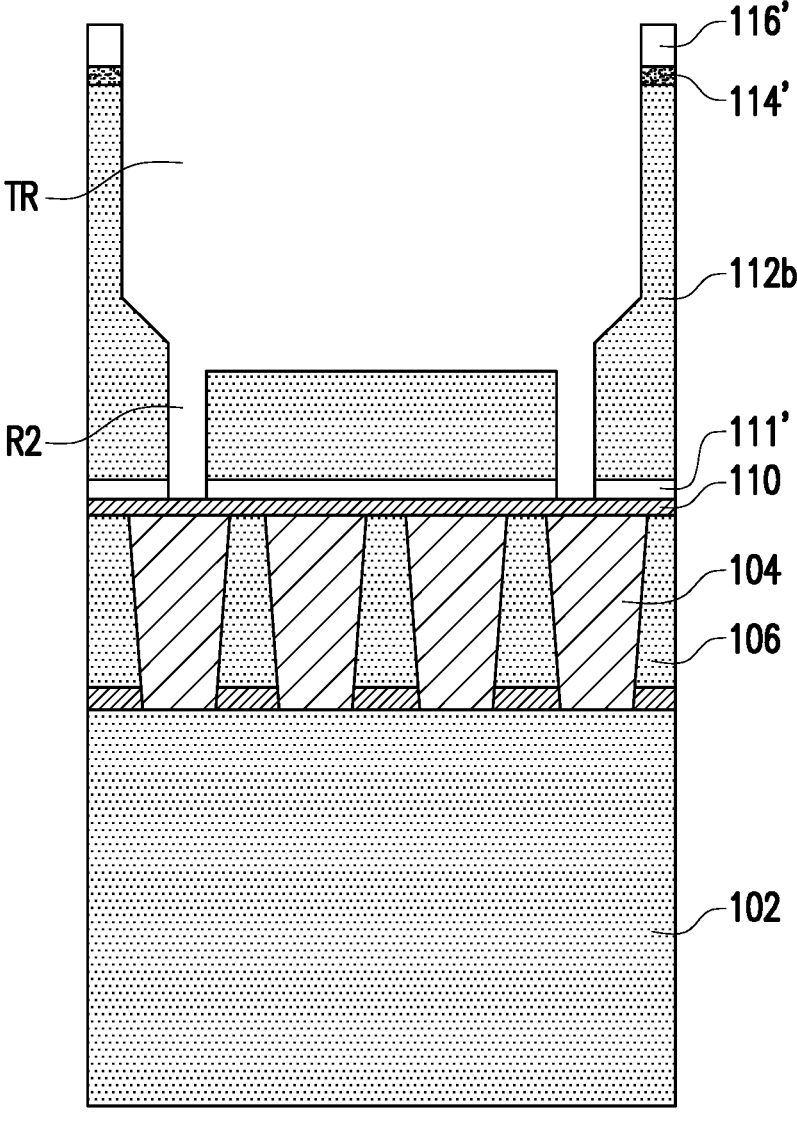

Referring to FIG. 6 and FIG. 7, after removing the patterned bottom layer 224', the patterned second dielectric layer 112a and the adhesion layer 111 are further patterned by using the patterned first dielectric layer 114', the patterned hard mask layer 116' and the patterned second dielectric layer 118' as a mask such that a patterned second dielectric layer 112b and a patterned adhesion layer 111' are formed. After the patterned second dielectric layer 112a and the adhesion layer 111 are patterned, the patterned second dielectric layer 118' is removed and the top surface of the patterned hard mask layer 116' is revealed. After the patterned second dielectric layer 112a and the adhesion layer 111 are patterned, recesses R2 are formed in the patterned second dielectric layer 112b and the patterned adhesion layer 111', and a trench TR is formed in the patterned second dielectric layer 112b. As illustrated in FIG. 7, the trench TR communicates with the recesses R2, and portions of the etch stop layer 110 are revealed by the trench TR and the recesses R2. In some embodiments, the trench TR and the recesses R2a may be formed by a dry etching process.

The above-mentioned dry etching process for forming the recesses R2 may be or include a plasma treatment using an etch gas including oxygen gas ($O_2$), carbon dioxide ($CO_2$) or another applicable gas. In addition to gas, the dry etching process may be fine-tuned with various parameters, such as pressure, power, temperature and/or other suitable parameters.

In some embodiments, the above-mentioned dry etching processes (FIG. 4 through FIG. 7) for forming the patterned tri-layer photoresist structure 220', the recesses R1, the recesses R2, the vias V and the trench TR are different stages of a same plasma treatment. In some alternative embodiments, the above-mentioned dry etching processes (FIG. 4 through FIG. 7) for forming the patterned tri-layer photoresist structure 220', the recesses R1, the recesses R2, the vias V and the trench TR are different plasma treatments.

Figure 8:
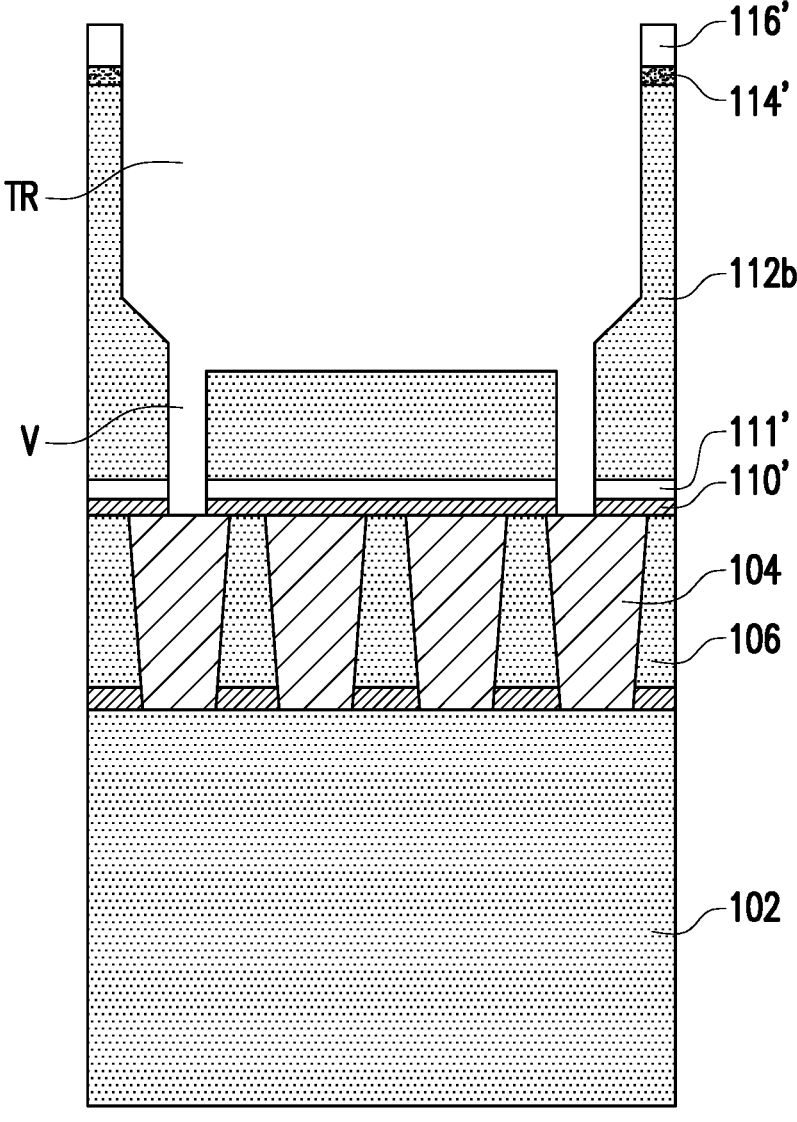

Referring to FIG. 7 and FIG. 8, after forming the trench TR and the recesses R2, the revealed portions of the etch stop layer 110 are removed until the first metal layer 104 is revealed. After the revealed portions of the etch stop layer 110 are removed, a patterned etch stop layer 110' is formed, and multiple vias V are formed in the patterned second dielectric layer 112b, the patterned adhesion layer 111' and the patterned etch stop layer 110'. After forming the vias V, the patterned first dielectric layer 114' and the patterned hard mask layer 116' remain on the top surface of the patterned second dielectric layer 112b. As illustrated in FIG. 8, the vias V and the trench TR collectively constitute a trench-via structure for use as a dual damascene cavity. The vias V have a width ranging from about 30 nm to about 60 nm. The trench TR has a width greater than the width of the vias V. The trench TR communicates with the vias V, and portions of the first metal layer 104 are revealed by the trench TR and the vias V. In some embodiments, the vias V may be formed by a wet etching process.

Since the patterned hard mask layer 116' is made of tungsten carbide (WC), a single etch stop layer 110 is utilized as well as the trench TR and the vias V are formed through merely a single cycle of one dry etching process and one wet etching process, the dimension of the trench TR is substantially equal to the trench defined in the patterned tri-layer photoresist structure 120' (FIG. 2), and the dimension of the vias V is substantially equal to the via openings defined in the patterned top layer 228' (FIG. 4). In other words, the trench defined in the patterned tri-layer photoresist structure 120' (FIG. 2) and the via openings defined in the patterned top layer 228' (FIG. 4) can be almost truly transferred to the underlying layers. In some embodiments, the difference between the dimension of the trench defined in the patterned tri-layer photoresist structure 120' and the trench TR is less than about 0.1 nm.

The design rule regarding to the spacing between adjacent trenches and via openings can further shrink to meet the requirements of advanced fabrication processes (e.g., 3 nm process or 5 nm process) when the dimension of the trench and the via openings can be controlled precisely.

Since the dimension of the trench TR and the dimension of the vias V can be controlled precisely through the film stack illustrated in FIG. 1 as well as the process illustrated in FIG. 2 through FIG. 8, the spacing between adjacent vias V and/or the spacing between adjacent trenches TR can be controlled precisely. Accordingly, the process window for fabricating the vias V and the trench TR can be significantly enlarged.

Figure 9:
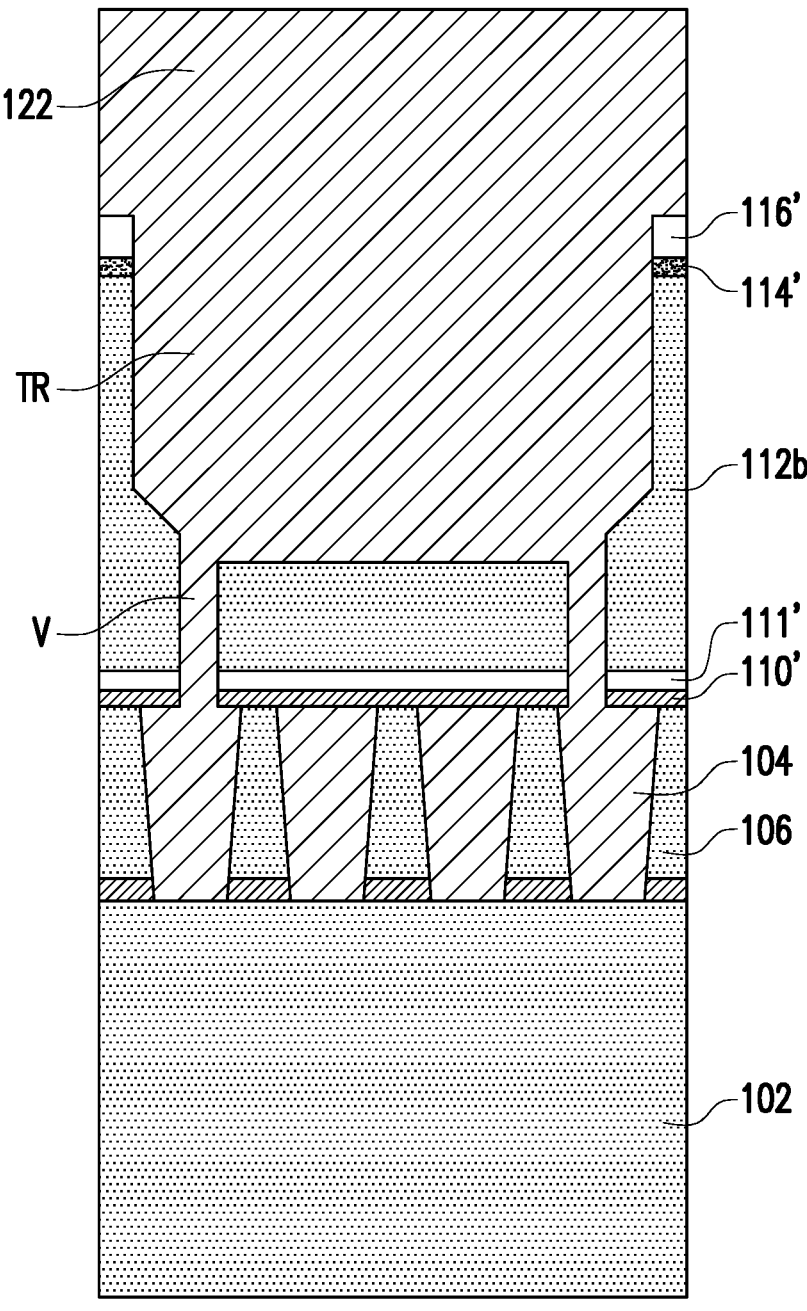

Referring to FIG. 9, a conductive material 122 is deposited over the patterned first dielectric layer 114', the patterned hard mask layer 116' and the patterned second dielectric layer 112b to fill the trench TR and the vias V. The conductive material 122 may have a top surface located at a level height higher than the top surface of the patterned hard mask layer 116'. In some embodiments, the conductive material 122 is deposited through a chemical vapor deposition process. For example, a sputtering process is performed to form a Ti/Cu seed layer covering the patterned first dielectric layer 114', the patterned hard mask layer 116', the patterned second dielectric layer 112b, sidewalls of the patterned etch stop layer 110', sidewalls of the patterned adhesion layer 111' and the revealed portions of the first metal layer 104. Then, a plating process is performed to deposit a copper (Cu) material layer over the sputtered seed layer. The sputtered Ti/Cu seed layer and the plated copper material layer collectively constitute the conductive material 122.

Figure 10:
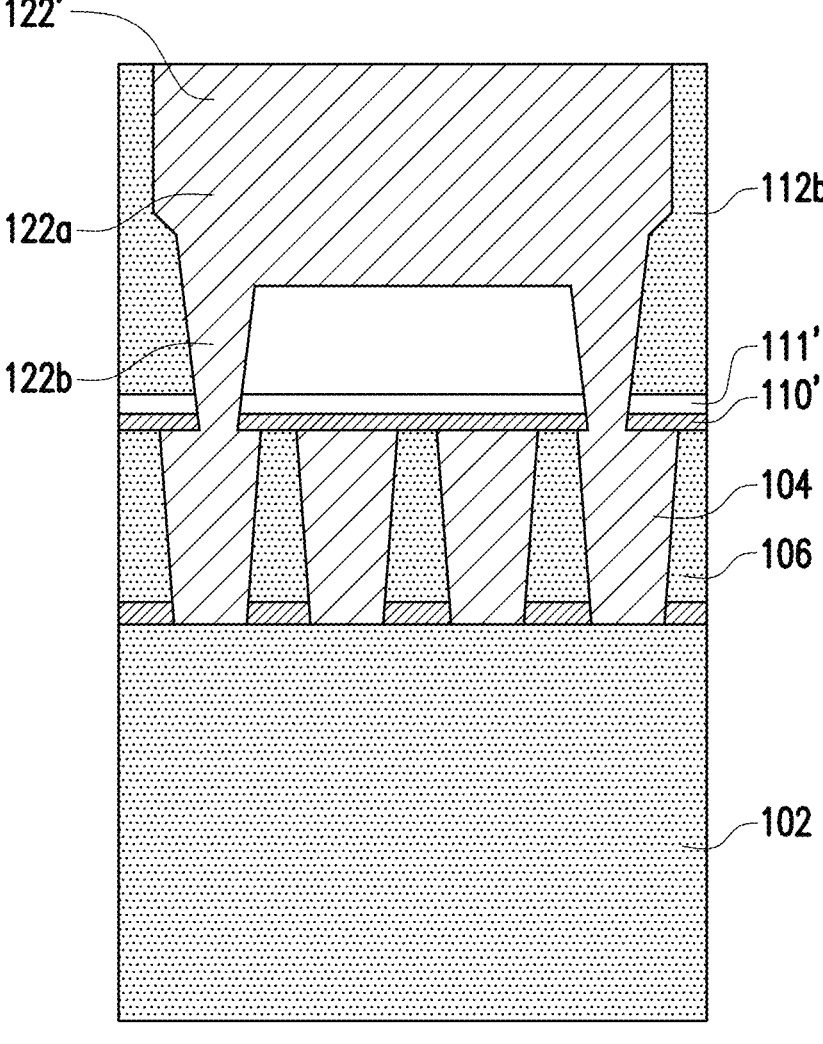

Referring to FIG. 9 and FIG. 10, after forming the conductive material 122, a portion of the conductive material 122 located outside the trench TR and the vias V is removed until the patterned first dielectric layer 114', the patterned hard mask layer 116' and an upper portion of the patterned second dielectric layer 112b are removed. In some embodiments, the patterned first dielectric layer 114', the patterned hard mask layer 116' and the upper portion of the patterned second dielectric layer 112b are removed by a chemical mechanical polishing (CMP) process. After performing the removal process of the patterned first dielectric layer 114', the patterned hard mask layer 116' and then upper portion of the patterned second dielectric layer 112b, a patterned second dielectric layer 112b and a dual damascene structure 122' embedded in the patterned second dielectric layer 112b are formed. As illustrated in Figure, the dual damascene structure 122' may include a trench portion 122a and via portions 122b. The top surface of the trench portion 122a substantially levels with the top surface of the patterned second dielectric layer 112b.

Figure 11:
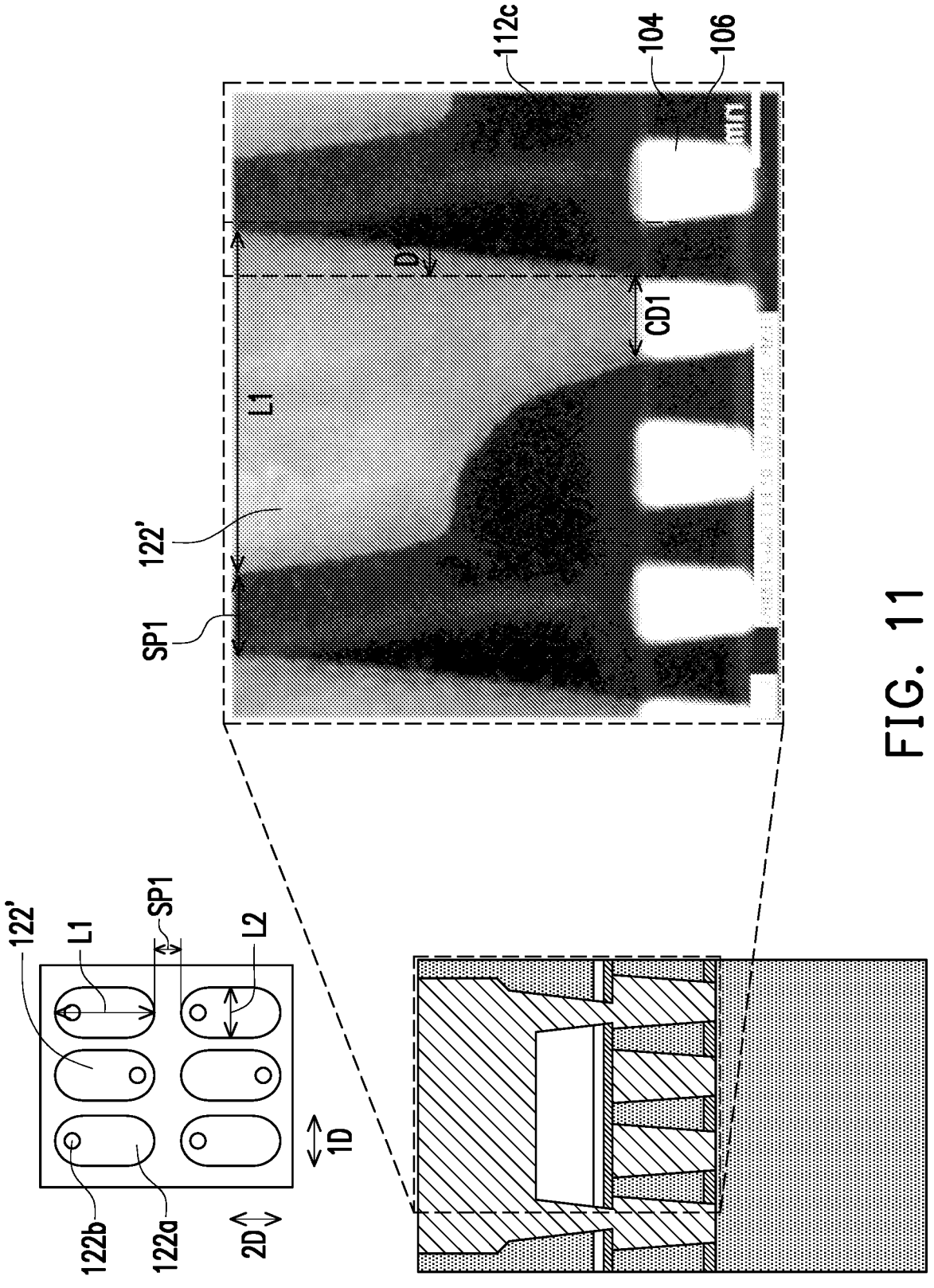
FIG. 11 is a diagram schematically illustrating the dimensions of the dual damascene structure in accordance with some embodiments of the present disclosure.

FIG. 11 is a diagram schematically illustrating the dimensions of the dual damascene structure in accordance with some embodiments of the present disclosure.

As illustrated in upper-left portion of FIG. 11, the dual damascene structures 122' are arranged in array. Each dual damascene structure 122' has a first dimension L1 in the direction 2D. Each dual damascene structure 122' has a second dimension L2 in the direction 1D which is less than the first dimension L1. In the direction 1D, dual damascene structures 122' are spaced apart from each other by a spacing SP1.

As illustrated in FIG. 11, in some embodiments, the difference between the first dimension L1 and the spacing SP1 (i.e., L1-SP1) ranges from about 37.53 to about 44.02. The difference between the first dimension L1 and the spacing SP1 (i.e., L1-SP1) may be about 40.55.

In some embodiments, a lateral shift D1 shown in right portion of FIG. 11 ranges from about 9.53 to about 10.86 which may enhance the gap filling capacity of the subsequently formed conductive material. The lateral shift D1 may be about 10.09.

In some embodiments, a ratio of spacing SP1 to the top dimension CD1 of the first meta layer 104 ranges from about 0.84 to about 1.07. The ratio of spacing SP1 to the top dimension CD1 of the first meta layer 104 may be about 0.91.

In some embodiments, a ratio of spacing SP1 to the second dimension L2 ranges from about 0.38 to about 0.45. The ratio of spacing SP1 to the second dimension L2 may be about 0.42.

In accordance with some embodiments of the disclosure, a method for forming a semiconductor device includes followings. A metal layer is formed to embedded in a first dielectric layer. An etch stop layer is formed over the metal layer and the first dielectric layer. A second dielectric layer is formed over the etch stop layer. A portion of the second dielectric layer is removed to expose a portion of the etch stop layer and to form a via by a dry etching process. The portion of the etch stop layer exposed by the second dielectric layer is removed to expose the metal layer and to form a damascene cavity by a wet etching process. A damascene structure is formed in the damascene cavity. In some embodiments, the method further includes forming an adhesion layer over the etch stop layer, wherein the second dielectric layer is formed on the adhesion layer, and the second dielectric layer is in contact with the adhesion layer. In some embodiments, the via is formed by the dry etching process using a patterned tri-layer photoresist structure comprising a patterned bottom layer disposed on the second dielectric layer, a patterned middle layer disposed on the patterned bottom layer and a patterned top layer disposed on the patterned middle layer. In some embodiments, the patterned top layer comprises a positive photoresist layer or a negative photoresist layer, the patterned middle layer comprises a silicon-based layer, and the patterned bottom layer comprises a polymer layer. In some embodiments, the method further includes: forming a patterned hard mask layer over the second dielectric layer before forming the via, wherein the patterned hard mask layer comprises a trench, and the second dielectric layer is in contact with the patterned tri-layer photoresist structure through the trench. In some embodiments, the method further includes: forming an underlying dielectric layer disposed between the patterned hard mask layer and the second dielectric layer; and forming an overlying dielectric layer disposed between the patterned hard mask layer and patterned tri-layer photoresist structure. In some embodiments, the underlying dielectric layer is in contact with the patterned hard mask layer and the second dielectric layer, and the overlying dielectric layer is in contact with the patterned hard mask layer and patterned tri-layer photoresist structure. In some embodiments, the underlying dielectric layer and the overlying dielectric layer comprise an aluminum-containing insulating material. In some embodiments, the aluminum-containing insulating material comprises aluminum oxynitride. In some embodiments, the patterned hard mask layer comprises tungsten carbide.

In accordance with some other embodiments of the disclosure, a method for forming a semiconductor device structure includes the followings. An etch stop layer is formed over a substrate. A dielectric layer is formed over the etch stop layer. A hard mask layer is formed over the dielectric layer, wherein the hard mask layer comprising tungsten carbide. A trench is formed in the hard mask layer, and a portion of the dielectric layer is exposed by the trench. A patterned photoresist layer is formed over the hard mask layer and the portion of the dielectric layer exposed by the trench. The dielectric layer is etched through by performing a dry etching process to form a first trench and a recess in the dielectric layer by using the patterned photoresist layer as a first etch mask. The etch stop layer is etched through by performing a wet etching process to form a second trench and a via by using the hard mask layer as a second etch mask. In some embodiments, the method further includes forming an underlying dielectric layer on the dielectric layer before forming the hard mask layer over the dielectric layer. In some embodiments, the method further includes forming an overlying dielectric layer on the hard mask layer before forming the patterned photoresist layer over the hard mask layer. In some embodiments, a material of the underlying dielectric layer and the overlying dielectric layer comprises an aluminum-containing insulating material. In some embodiments, the dielectric layer and the etch stop layer are etched through a single cycle of dry etching process and wet etching process. In some embodiments, the method further includes filling a conductive material into the via and the second trench to form a dual damascene structure comprising a via portion disposed in the via and a trench portion disposed in the second trench.

In accordance with some other embodiments of the disclosure, a semiconductor device including a metal layer, a patterned etch stop layer, a patterned adhesion layer, a second dielectric layer and a dual damascene structure is provided. The metal layer is embedded in a first dielectric layer. The patterned etch stop layer is disposed on the metal layer and the first dielectric layer. The patterned adhesion layer is disposed on and in contact with the patterned etch stop layer. The second dielectric layer is disposed on and in contact with patterned adhesion layer. The dual damascene structure is embedded in the second dielectric layer and the patterned etch stop layer, and the dual damascene structure being electrically connected to the metal layer. In some embodiments, the semiconductor device further includes a semiconductor substrate comprising an interconnect structure, wherein the interconnect structure comprises the metal layer, the first dielectric layer, the patterned etch stop layer, the patterned adhesion layer, the second dielectric layer and the dual damascene structure are included in the interconnect structure. In some embodiments, wherein the dual damascene structure comprises a via portion and a trench portion, the trench portion is embedded in the second dielectric layer, and the via portion is embedded in the second dielectric layer, the patterned etch stop layer and the patterned adhesion layer. In some embodiments, the patterned etch stop layer comprise an aluminum-containing insulating material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:

forming a first metal layer and a second metal layer in a first dielectric layer;

forming an etch stop layer over the first metal layer, the second metal layer and the first dielectric layer;

forming a second dielectric layer over the etch stop layer;

removing portions of the second dielectric layer to expose portions of the etch stop layer and to form a first via and a second via by a dry etching process;

removing the portions of the etch stop layer exposed by the first via and the second via formed in the second dielectric layer to expose the first metal layer and the second metal layer so as to form a first damascene cavity and a second damascene cavity by a wet etching process; and forming a first damascene structure in the first damascene cavity and forming a second damascene structure in the second damascene cavity, the first damascene structure and the second damascene structure having a first dimension in a first direction, the first damascene structure and the second damascene structure having a second dimension in a second direction, the first damascene structure and the second damascene structure being spaced apart from each other by a spacing in the first direction, and the first metal layer and the second metal layer having a third dimension in the first direction, wherein the second dimension is less than the first dimension, and a ratio of the spacing to the third dimension ranges from about 0.84 to about 1.07.

2. The method as claimed in claim 1, wherein a center of the first via laterally offsets from a center of the first damascene cavity.

3. The method as claimed in claim 1, wherein the first via and the second via are formed by the dry etching process using a patterned tri-layer photoresist structure comprising a patterned bottom layer disposed on the second dielectric layer, a patterned middle layer disposed on the patterned bottom layer and a patterned top layer disposed on the patterned middle layer.

4. The method as claimed in claim 3, wherein the patterned top layer comprises a positive photoresist layer or a negative photoresist layer, the patterned middle layer comprises a silicon-based layer, and the patterned bottom layer comprises a polymer layer.

5. The method as claimed in claim 3 further comprising:
forming a patterned hard mask layer over the second dielectric layer before forming the first via and the second via.
6. The method as claimed in claim 5 further comprising:
forming an underlying dielectric layer disposed between the patterned hard mask layer and the second dielectric layer; and
forming an overlying dielectric layer disposed between the patterned hard mask layer and patterned tri-layer photoresist structure.
7. The method as claimed in claim 6, wherein the underlying dielectric layer is in contact with the patterned hard mask layer and the second dielectric layer, and the overlying dielectric layer is in contact with the patterned hard mask layer and patterned tri-layer photoresist structure.
8. The method as claimed in claim 6, wherein the underlying dielectric layer and the overlying dielectric layer comprise an aluminum-containing insulating material.
9. The method as claimed in claim 1, wherein a ratio of the spacing to the second dimension ranges from about 0.38 to about 0.45.
10. The method as claimed in claim 1, wherein the first damascene structure substantially aligns with the second damascene structure substantially align in the first direction.
11. A method for forming a semiconductor device structure, comprising:
forming an etch stop layer over a first metal layer and a second metal layer;
forming a dielectric layer over the etch stop layer;
forming a hard mask layer over the dielectric layer, wherein the hard mask layer comprising tungsten carbide;
forming trenches in the hard mask layer, a portion of the dielectric layer being exposed by the trenches;
forming a patterned photoresist layer over the hard mask layer and the portion of the dielectric layer exposed by the trenches;
etching through the dielectric layer by performing a dry etching process to form first trenches and first recesses in the dielectric layer by using the patterned photoresist layer as a first etch mask;
etching through the etch stop layer by performing a wet etching process to form second trenches and vias by using the hard mask layer as a second etch mask; and
filling a conductive material into the vias and the second trenches to form a first damascene structure and a second damascene structure, the first damascene structure comprising a first via portion formed in one of the vias and a first trench portion formed in one of the second trenches, and a center of the first via portion being laterally offset from a center of the first trench portion, the second damascene structure comprising a second via portion formed in another one of the vias and a second trench portion formed in another one of the second trenches, and a center of the second via portion being laterally offset from a center of the second trench portion,
wherein the first damascene structure and the second damascene structure have a first dimension in a first direction, the first damascene structure and the second damascene structure have a second dimension in a second direction, the first damascene structure and the second damascene structure are spaced apart from each other by a spacing in the first direction, and the first metal layer and the second metal layer have a third dimension in the first direction, and wherein the second dimension is less than the first dimension, and a ratio of the spacing to the third dimension ranges from about 0.84 to about 1.07.
12. The method as claimed in claim 11 further comprising:
forming an underlying dielectric layer on the dielectric layer before forming the hard mask layer over the dielectric layer.
13. The method as claimed in claim 12 further comprising:
forming an overlying dielectric layer on the hard mask layer before forming the patterned photoresist layer over the hard mask layer.
14. The method as claimed in claim 13, wherein a material of the underlying dielectric layer and the overlying dielectric layer comprise an aluminum-containing insulating material.
15. The method as claimed in claim 11, wherein the dielectric layer and the etch stop layer are etched through a single cycle of dry etching process and wet etching process.
16. The method as claimed in claim 11, wherein a ratio of the spacing to the third dimension ranges from about 0.84 to about 1.07.
17. A method for forming a semiconductor device, comprising:
forming a first metal layer and a second metal layer embedded in a first dielectric layer;
forming an etch stop layer over the first metal layer, the second metal layer and the first dielectric layer;
forming a second dielectric layer over the etch stop layer;
forming a dielectric stack on the second dielectric layer;
forming a first patterned tri-layer photoresist structure on the dielectric stack;
patterning the dielectric stack by using the first patterned tri-layer photoresist structure as a mask to form trenches in the dielectric stack;
after the trenches is formed in the dielectric stack, forming a second patterned tri-layer photoresist structure to cover the dielectric stack;
patterning the second dielectric layer by using the second patterned tri-layer photoresist structure as a mask to form first recesses in the second dielectric layer;
removing the second patterned tri-layer photoresist structure to expose the dielectric stack;
removing a portion of the second dielectric layer to expose a portion of the etch stop layer and to form second recesses by using the dielectric stack as a mask;
performing a wet etching process to remove the portion of the etch stop layer exposed by the second dielectric layer to expose the first metal layer and the second metal layer so as to form a first damascene cavity and a second damascene cavity; and
forming a first damascene structure in the damascene cavity and forming a second damascene structure in the second damascene cavity, the first damascene structure and the second damascene structure having a first dimension in a first direction, the first damascene structure and the second damascene structure having a second dimension in a second direction, the first damascene structure and the second damascene structure being spaced apart from each other by a spacing in the first direction, and the first metal layer and the second metal layer having a third dimension in the first direction, wherein the second dimension is less than the first dimension, and a ratio of the spacing to the third dimension ranges from about 0.84 to about 1.07.

18. The method as claimed in claim 17, wherein prior to patterning the second dielectric layer, the second patterned tri-layer photoresist structure comprises a patterned bottom layer covering the dielectric stack, a patterned middle layer disposed on the patterned bottom layer and a patterned top layer disposed on the patterned middle layer, and after forming the first recesses in the second dielectric layer, the patterned top layer and the patterned middle layer are removed.

19. The method as claimed in claim 17, wherein forming a dielectric stack on the second dielectric layer comprises:

forming an underlying dielectric layer on the second dielectric layer;

forming a hard mask layer on the underlying dielectric layer; and forming an overlying dielectric layer on the hard mask layer.

20. The method as claimed in claim 17, wherein a ratio of the spacing to the second dimension ranges from about 0.38 to about 0.45.

\* \* \* \* \*